United States Patent [19]
Srinivasan et al.

[11] Patent Number: 5,696,784
[45] Date of Patent: Dec. 9, 1997

[54] REDUCED MODE LASER AND METHOD OF FABRICATION

[75] Inventors: Swaminathan Thandalai Srinivasan, Tucson, Ariz.; Rajiv Agarwal, Calcutta, India; Kenneth Joseph Thibault; Rushikesh Patel, both of Tucson, Ariz.

[73] Assignee: Opto Power Corporation, Tucson, Ariz.

[21] Appl. No.: 634,771

[22] Filed: Apr. 19, 1996

[51] Int. Cl.$^6$ .................. H01S 3/19; H01L 21/20
[52] U.S. Cl. .................. 372/46; 372/43; 372/44; 372/45; 372/50; 437/51; 437/129
[58] Field of Search .................. 372/38, 43, 44, 372/45, 46, 48, 50; 437/51, 129

[56] References Cited

U.S. PATENT DOCUMENTS

| | | | |
|---|---|---|---|
| 5,420,880 | 5/1995 | Tabatabaie et al. | 372/46 |
| 5,495,492 | 2/1996 | Toda | 372/45 |
| 5,504,769 | 4/1996 | Pellegrino et al. | 372/46 |
| 5,563,902 | 10/1996 | Xu et al. | 372/50 |

*Primary Examiner*—Brian Healy
*Attorney, Agent, or Firm*—Herbert M. Shapiro

[57] ABSTRACT

A reduced, lateral mode laser diode is fabricated using a self-aligning process which produces a well controlled weakly index-guided waveguide with strong current confinement. The structure includes ion implants for controlling current injection into the active region from the top of the ridge. The number of modes may be reduced to unity, resulting in a single lateral mode laser. A laser diode array is fabricated in the same way.

7 Claims, 8 Drawing Sheets

REDUCED MODE LASER AND METHOD OF FABRICATION

FIELD OF INVENTION

This invention relates to index-guided lasers and amplifiers with a reduced number of modes.

BACKGROUND OF THE INVENTION

It is important for many applications that a laser produce a bright, highly focused spot. In order to achieve such a spot, it is necessary to reduce the number of spatial modes that are present in the output of the laser. In particular, one would prefer the fundamental spatial mode to be the main component of the output. In order to reduce the number of modes, one approach that has been proven to work involves fabricating a laser with a confinement structure, or waveguide. For wavelengths between 0.8 µm (micron) and 1.5 µm, waveguides between 1 and 6 microns wide are needed to operate with a fundamental lateral mode. Besides the width of the waveguide, the amount of index-guiding (represented by the difference in the index that the light would see if it were inside as opposed to outside the waveguide) also plays a role in deciding the number of modes that may exist in the waveguide. The control of the width of the waveguide and the strength of the index-guiding can be achieved in many different ways; this invention presents a simple approach to fabricating single mode lasers and amplifiers.

BRIEF DESCRIPTION OF THE INVENTION

In accordance with the principles of this invention, a self-aligned process is employed along with ion implants to achieve weak index guiding using a ridge waveguide. As the functions of current-confinement and optical index-guiding can each be optimized without much compromise, the resulting structure and method of fabrication are considered to be significant departures from prior-art thinking and lead to a significant improvement in performance.

Prototype devices fabricated as an array have exhibited, for example, fifty to one hundred milliwatts of single mode output per element at an approximate wavelength of 806 nanometers. The far-field lateral divergence of these prototype devices is less than 10 degrees, which corresponds to an emitting aperture of approximately 9.5 microns. This design thus allows the fabrication of relatively large waveguides (in the lateral direction), leading to lower far-field divergence. While improving reliability of the devices by reducing the optical power density at the facet, the larger width of the waveguide helps in reducing the series resistance of the device when placed in an electrical circuit. Due to the reduced overlap between the optical mode and the available gain, the threshold current of the laser will increase; however, optimized design of the laser should lead to good performance due to the significant benefits. Another advantage of the process and the corresponding structure is that the ridge waveguide's sidewalls need not be close to being vertical, while the tolerances for the smoothness of the walls are also relaxed. These are benefits resulting from the reduced etch depth requirement and weak interaction of the optical field with the ridge, respectively. The fabrication of the ridge waveguide may be done by a wet-etching or dry etching process. In either case, this fabrication process will lead to greater tolerance for manufacturing variations, which should improve yield.

DETAILED DESCRIPTION OF ILLUSTRATIVE EMBODIMENTS OF THIS INVENTION

Figure 1:
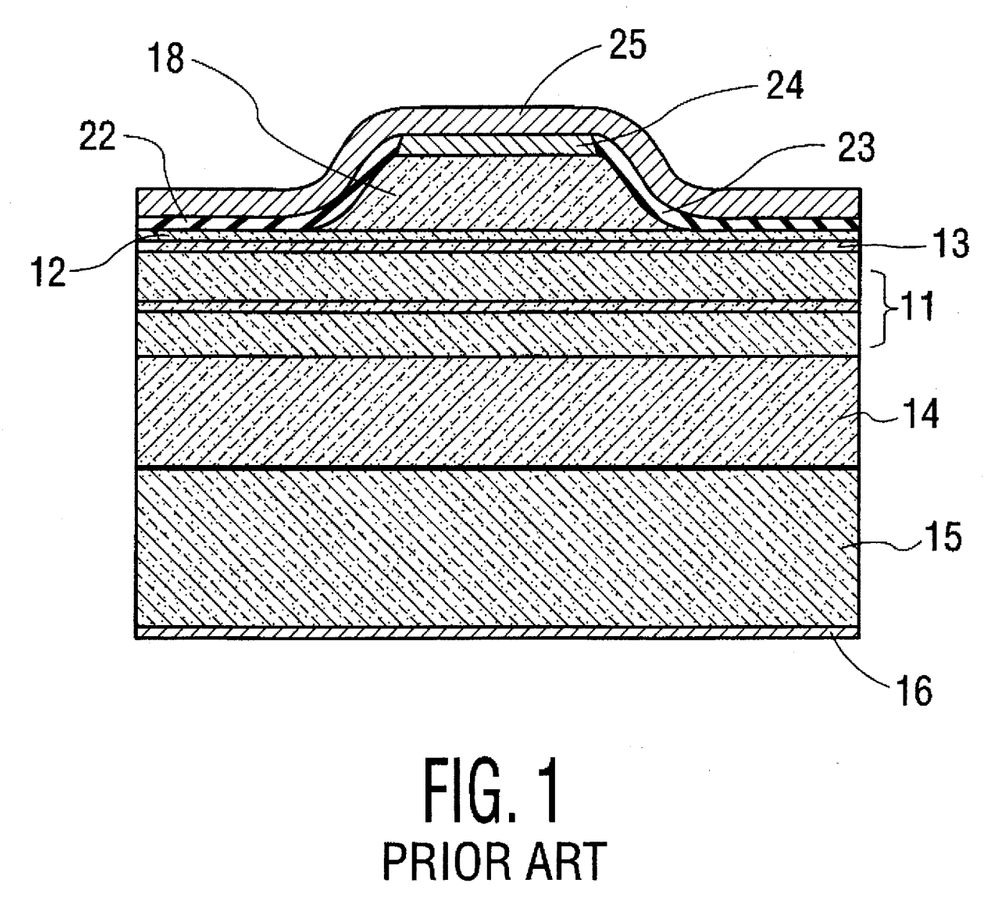
FIG. 1 is a schematic end view of a prior art reduced lateral mode laser structure.

FIG. 1 shows an end view of a prior art lateral mode laser with reduced output modes. The laser has an active region 11 with cladding layers 13 and 14 above and below the active region respectively. Below the cladding layer is the substrate 15 upon which the structure is grown.

Cladding layer 13 is of reduced thickness except at one (ridge) 18. The reduction in thickness is accomplished by etching which leaves the remaining area (18) with (i.e.) slanted side walls. The etch depth is determined by the position of stop-etch layer 12. The side walls and top of the ridge are coated with electrically-insulating material, 22 and 23 and a window is opened in this electrically-insulating layer at the top of a "cap" layer 24 to provide for current injection into ridge 18. The opening of the window at the top of the ridge could present a problem because it may be a critical alignment step which could result in a loss in yield. A metal contact 25 is provided over the ridge as shown. Substrate 15 is contacted with metal layer 16.

Figure 2:
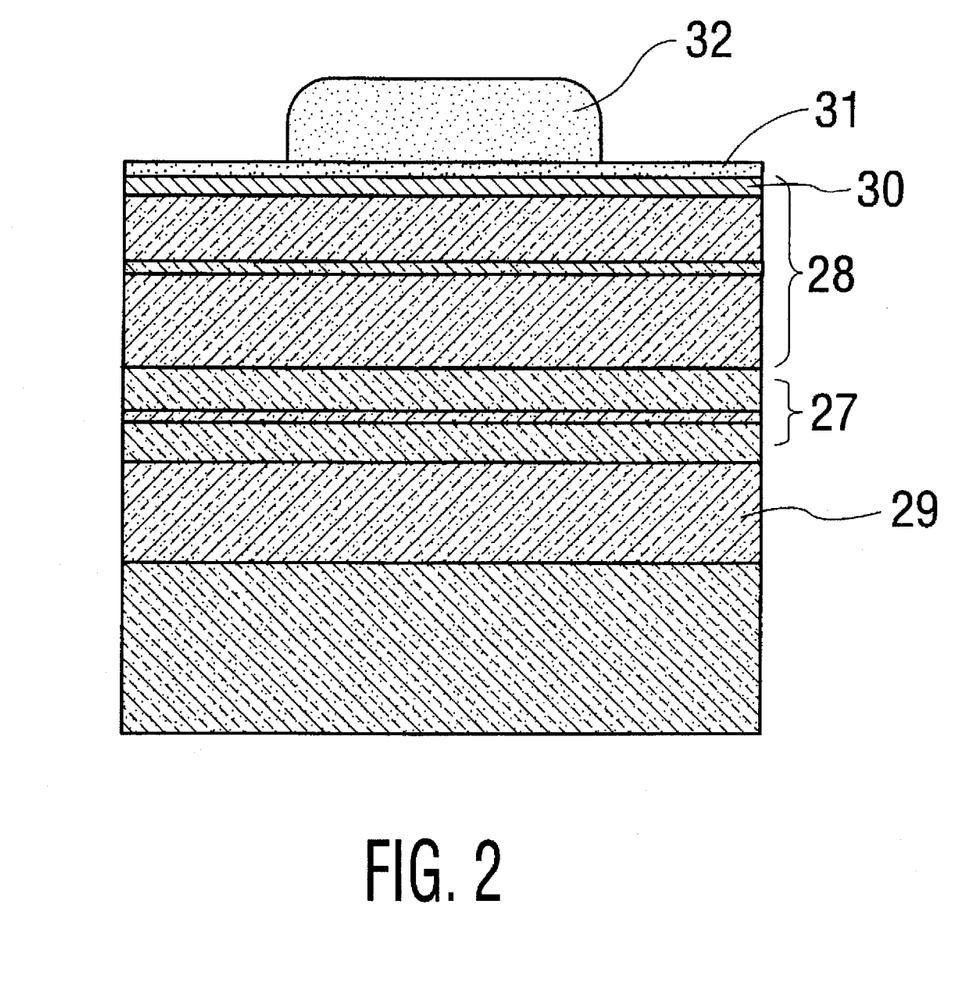
FIGS. 2 through 7 are schematic end views of a lateral mode laser structure during the consecutive processing steps in accordance with the principles of this invention.

FIG. 2 shows the initial step in a process in accordance with the principle of this invention. As was the case with the prior art structure of FIG. 1, the laser comprises an active region 27 with top and bottom cladding layers 28 and 29 (as viewed). The outermost component of cladding layer 28 is "cap" layer 30, which acts as an electrical contact layer. Cladding layer 28 may be coated (i.e.) with a dielectric layer 31, which is optional. Layer 31 has a strip of photoresist 32 deposited on it. Cladding layer 28 contains an optional stop-etch layer 26 (shown in FIG. 3) comprised of material with a different composition, which may be used to control the height of the ridge.

Figure 3:
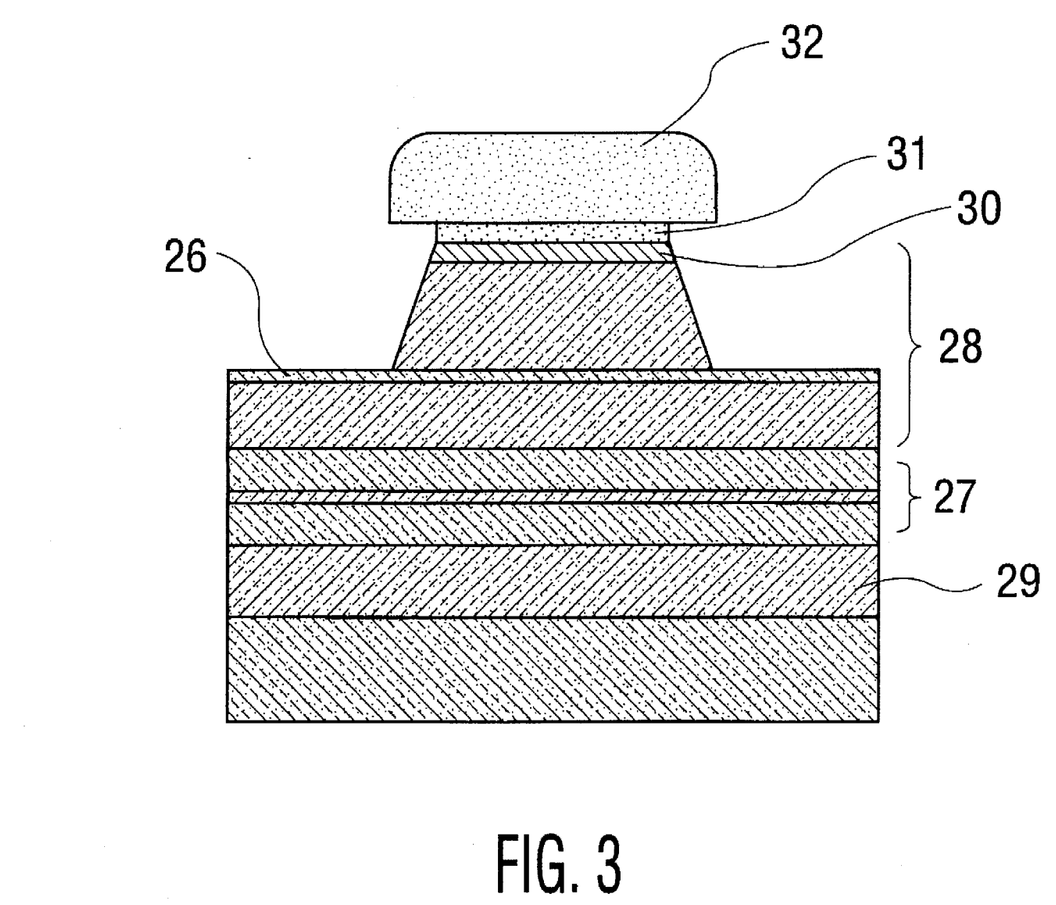

The dielectric (which is optional) and cladding layers, 31 and 28 respectively, are now etched. The resulting structure is shown in FIG. 3. The etching step may undercut the photoresist strip 32, leaving either slanted sidewalls or vertical sidewalls depending on the etch. The etch depth may be controlled by calibration of the etch rate and further by using a slow-etching material in the optional stop-etch layer 26.

Figure 4:
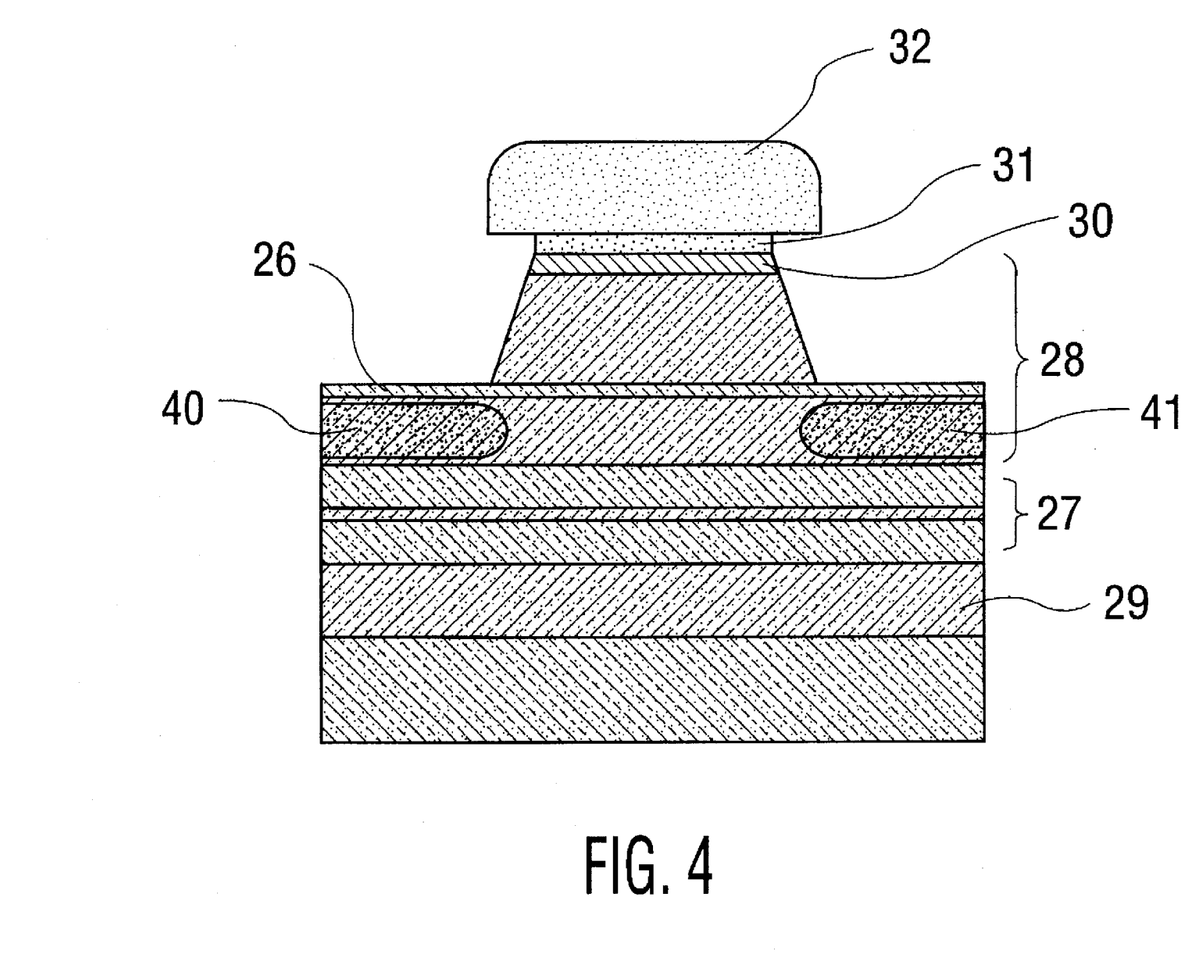

The next step in the fabrication is to form ion implant areas 40 and 41 in cladding layer 28 along the base of the ridge where the contour of the ion implant areas, as shown, in FIG. 4, represents high density (arbitrarily chosen for this depiction) of the implanted species. Implantation is a well known and characterized process routinely used in the microelectronics industry wherein suitably chosen elemental species are implanted to change electrical and other properties of the implanted material. The implantation is "masked" by the photoresist layer 32 and dielectric layer, 31, if present.

Figure 5:
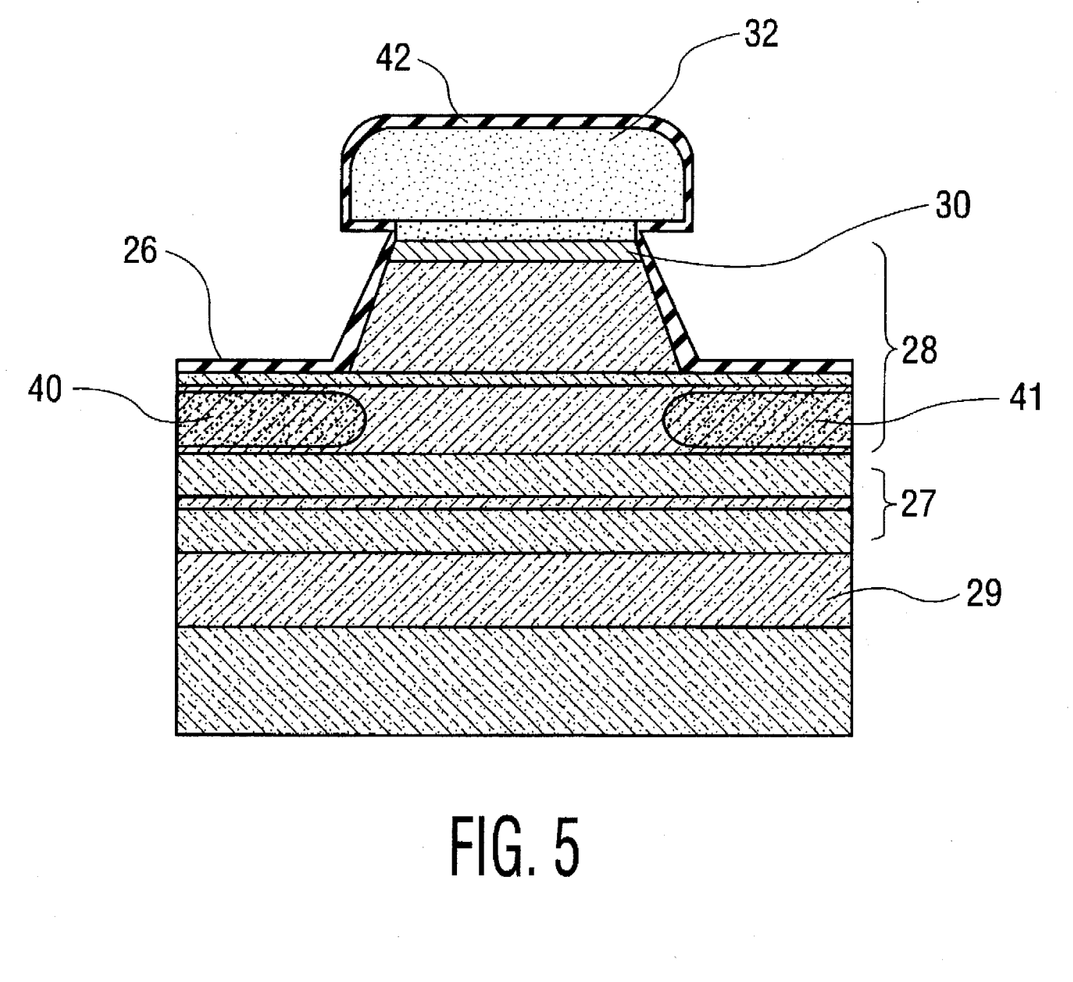
Figure 6:
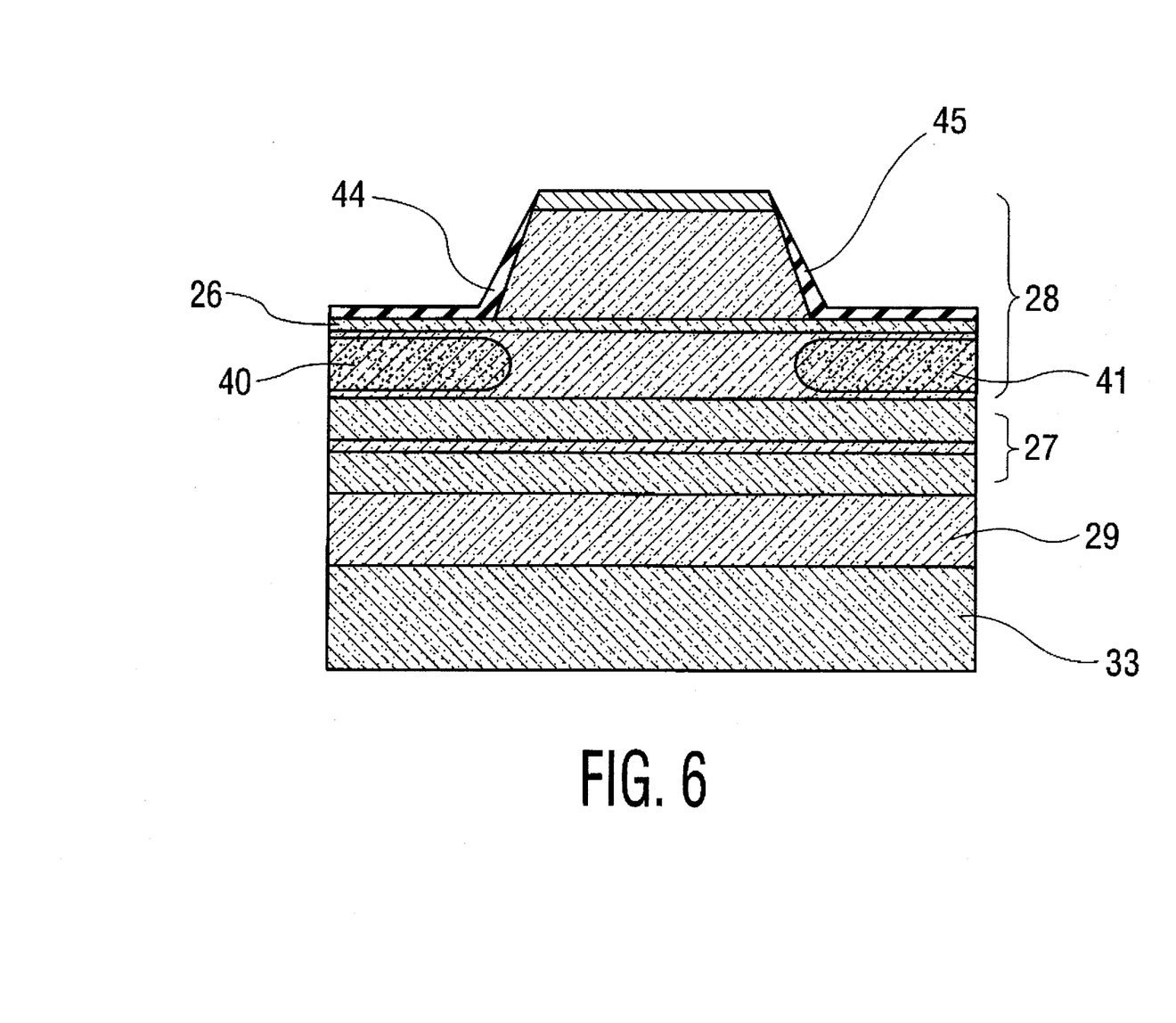
Figure 7:
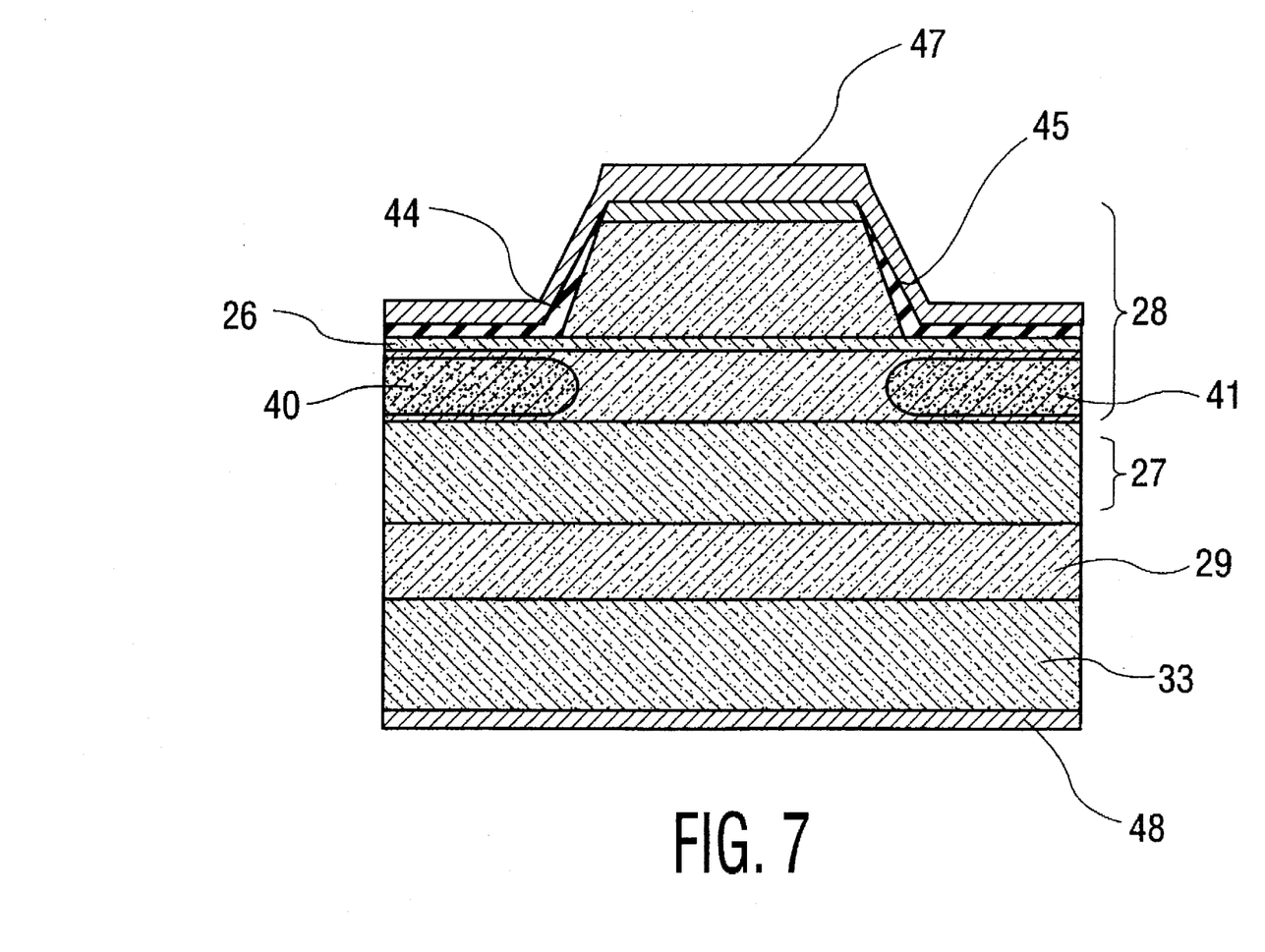

An optional layer 42 of electrically insulating material, such as Silicon Dioxide or Silicon, maybe deposited over the structure as represented in FIG. 5. This electrically insulating material, if deposited, should be different from the material used in layer 31. Photoresist layer 32 and dielectric layer 31 (if present) are removed as shown in FIG. 6 to leave two separate insulating layers 44 and 45. A layer of metal 47 is deposited over the top of the structure as shown in FIG. 7.

The substrate 33 is now thinned (lapped and polished to desired thickness, e.g., 100 microns) and metal electrode 48 is deposited on it. FIG. 7 represents the final structure in accordance with the principles of this invention. Since the process discussed in connection with FIGS. 2 through 7 requires no window to be opened along the top of the characteristic ridge, no critical alignment steps are required.

In one specific embodiment, a laser in accordance with the principles of this invention was made starting with Gallium Arsenide with a conventional Aluminum Gallium Arsenide cladding. The Gallium Arsenide active region contained a quantum well, which determines the wavelength of light generated in the active region. The active region's lateral dimension, as viewed in FIG. 7, was ~5 microns, the ideal dimension being between one and six microns. The etching of cladding layer (of FIG. 3) employed chemical etching, which produced the slanted side walls to the ridge, removed about one half the thickness of the cladding layer (28). The ion implants, in the illustrative embodiment comprised proton implantation of Hydrogen (other elements may also be used, such as Oxygen) introduced by well understood techniques. The ion implant causes the current, introduced at the top of the ridge, to spread less before it reaches the active region, where the light is generated.

The ridge width, in the illustrative embodiment was five microns and the height of the ridge was approximately 0.5 microns. The Hydrogen implants were to a depth of approximately 0.5 microns. The distance from the top of the ridge to the active region was between 1.0 and 1.5 microns. The structure produced one hundred milliwatts of single spatial mode output power at a wavelength of approximately 800 nanometers.

Figure 8:
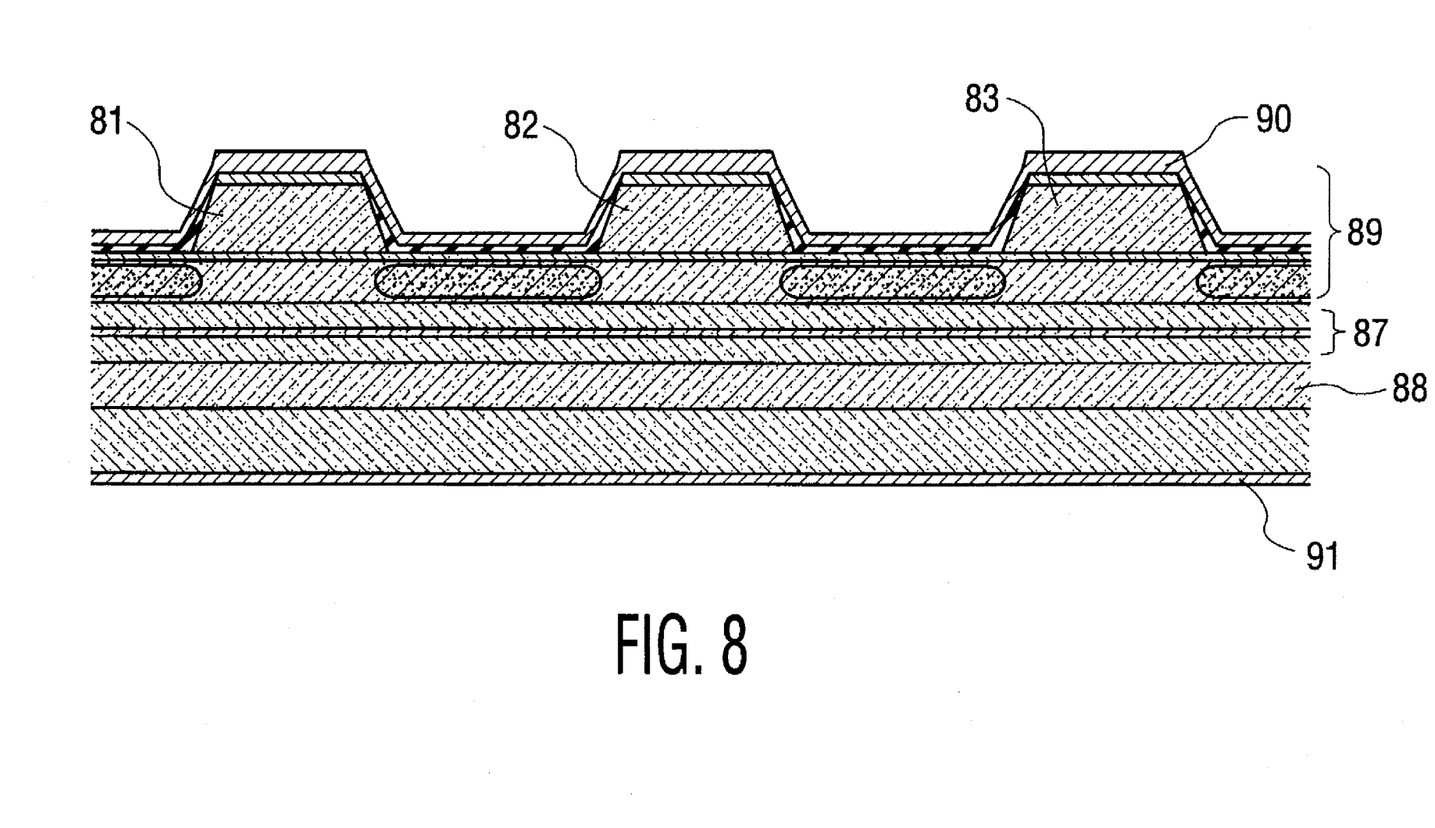
FIG. 8 is a schematic end view of a laser array made by the process of FIGS. 2 through 7.

FIG. 8 shows an end view of a diode laser array segment 80 made with the process discussed in connection with FIGS. 2 through 7. The array, illustratively, shows three ridge waveguide elements 81,82 and 83. The elements share a common active region 87, common cladding layers 88 and 89, and a metal layer 90 (In other embodiments of this approach, the metal layers 90 and 91 may be discontinuous in between ridge elements. Cladding layer 89 is etched, as discussed in connection with FIG. 3, to provide the three ridges shown in FIG. 8. The individual ion implant regions as shown in FIG. 3 essentially coalesce into single implant regions between the ridges shown in FIG. 8. The dimensions of each ridge waveguide element in the array are consistent with those for an individual element above.

What is claimed is:

1. A process for fabricating a reduced lateral mode laser, said process comprising the steps of depositing an elongated strip of photoresist onto the cladding layer on one face of a laser active region, etching into but not through said cladding layer to either side of said photoresist strip in a manner to undercut said photoresist strip, forming first and second electrically insulating regions extending in said cladding layer along said ridge to first and second sides thereof, forming ion implanted regions in said cladding layer beneath said first and second electrically insulating regions to either side of said photoresist strip, depositing an electrically insulating layer over said photoresist strip and said cladding layer, removing said photoresist layer, and depositing a metal layer over said cladding layer.

2. A process for fabricating a reduced lateral mode laser, said process comprising the steps of depositing an elongated strip of photoresist onto the cladding layer on one face of a laser active region, etching into said cladding layer in a manner to undercut said photoresist strip, forming ion-implanted regions in said cladding layer to either side of said photoresist strip, depositing an electrically insulating layer over said photoresist strip and said cladding layer, removing said photoresist layer, and depositing a metal layer over said cladding layer, wherein said cladding layer is etched to about half of it's original thickness.

3. A process as in claim 2 wherein said implant comprises Hydrogen ions.

4. A process as in claim 3 where in said implant comprises Oxygen ions.

5. A process as in claim 3 wherein said active region comprises Gallium Arsenide and said cladding layer comprises Aluminum Gallium Arsenide.

6. A laser diode with reduced mode output, said diode comprising an active region having a cladding layer formed on a first face thereof, a first metal layer coating said cladding layer, said cladding layer having an elongated ridge therein, said diode having first and second electrically insulating regions extending in said cladding layer along said ridge to either side of said ridge beneath said first metal layer, said cladding layer also including first and second ion implanted regions extending in said cladding layer thereaolong beneath said first and second electrically insulating regions respectively.

7. A laser diode array comprising a plurality of reduced lateral mode laser diodes as in claim 6.

* * * * *